US010693434B1

(12) United States Patent
Hertz et al.

(10) Patent No.: US 10,693,434 B1
(45) Date of Patent: Jun. 23, 2020

(54) RC TIME CONSTANT MEASUREMENT

(71) Applicant: Teledyne LeCroy, Inc., Thousand Oaks, CA (US)

(72) Inventors: Michael G. Hertz, Brighton, MI (US); Peter J. Pupalaikis, Ramsey, NJ (US)

(73) Assignee: Teledyne LeCroy, Inc., Thousand Oaks, CA (US)

( * ) Notice: Subject to any disclaimer, the term of this patent is extended or adjusted under 35 U.S.C. 154(b) by 347 days.

(21) Appl. No.: 15/665,746

(22) Filed: Aug. 1, 2017

Related U.S. Application Data

(60) Provisional application No. 62/381,229, filed on Aug. 30, 2016.

(51) Int. Cl.
*G01N 27/22* (2006.01)
*H03H 7/01* (2006.01)
*G01R 35/00* (2006.01)

(52) U.S. Cl.
CPC ......... *H03H 7/0153* (2013.01); *G01R 35/005* (2013.01); *H03H 2210/043* (2013.01)

(58) Field of Classification Search
CPC ........... H03H 7/0153; H03H 2210/043; G01R 35/005
See application file for complete search history.

(56) References Cited

U.S. PATENT DOCUMENTS

| | | | | |
|---|---|---|---|---|
| 6,275,047 B1* | 8/2001 | Zoellick | ............. | G01R 27/2605 324/548 |
| 8,810,546 B1* | 8/2014 | Kremin | ................ | G06F 3/0416 345/174 |
| 9,269,886 B1* | 2/2016 | McLean | ................ | H01L 41/042 |
| 2006/0061929 A1* | 3/2006 | Duvvury | ............. | H01L 27/0266 361/91.1 |
| 2007/0103826 A1* | 5/2007 | Hung | ..................... | H02H 9/046 361/56 |
| 2014/0178845 A1* | 6/2014 | Riesberg | ............. | G09B 23/181 434/301 |
| 2015/0160148 A1* | 6/2015 | Stanley | ................ | G01N 27/228 324/686 |
| 2016/0294348 A1* | 10/2016 | Ek | ............................ | H03K 5/24 |
| 2016/0377670 A1* | 12/2016 | Tamida | ................ | G01R 27/025 324/551 |

OTHER PUBLICATIONS

Charging Phase Capacitor Chp 10 (Year: 2003).*
(Continued)

*Primary Examiner* — Mohammad K Islam
(74) *Attorney, Agent, or Firm* — Andrew Dommer

(57) ABSTRACT

In general, the subject matter described in this disclosure can be embodied in methods, systems, and program products for characterizing a device under test. An electrical waveform is received from the device under test and sampled to generate an array of data values. User input selects a particular position of the electrical waveform on a display, and identifies a corresponding starting time. A decay of a value at the starting time is identified and the array is analyzed to identify multiple data values that correspond to the decayed value. An ending time is then determined using the multiple data values, and a decay time between the starting time and ending time is determined and presented on a display device.

20 Claims, 9 Drawing Sheets

(56) References Cited

OTHER PUBLICATIONS

North Carolina State University, Charge and Discharge of a Capacitor (Year: 2015).*
Edexcel, tutorial 1 (Year: 2016).*
Teledyne, EMC/ESD Pulse Measurements, IEEE (Year: 2016).*
International Standard ISO 10605:2001, Road vehicles—Test methods for electrical disturbances from electrostatic discharge, 2001, pp. 13-15.
M. Hertz, "Run MATLAB Inside an Oscilloscope's Data Flow", Test & Measurement World Magazine, Mar. 1, 2006.

* cited by examiner

```
 1  Set app = CreateObject("LeCroy.XStreamDSO") ' COM handle
 2  numSamples = InResult1.Samples ' number of sample points in acquisition
 3  scaledData = InResult1.DataArray(True) ' waveform sample points array
 4
 5  trigpt = app.Math.F4.Out.Result.HorizontalOffset ' Determine the trigger point /
      horizontal offset
 6  sampleres = app.Math.F4.Out.Result.HorizontalPerStep ' Determine the spacing
      between sample points
 7  horzunits = app.Math.F4.Out.Result.HorizontalUnits ' Query for units (e.g. Seconds,
      etc.)
 8  vertunits = app.Math.F4.Out.Result.VerticalUnits ' Query for units (e.g. volts, etc
      .)
 9
10  x2_array_position = numSamples - 2000 ' sample position for for X2 which places it
      on the rightmost graticule on the screen
11  x2_time_position = trigpt + (sampleres * x2_array_position) ' calculate the
      rightmost falling edge value in terms of time (rather than an array index)
12
13  e_constant = 0.367879441 ' constant
14  i = x2_array_position ' counter position
15  x1_target_value = scaledData(x2_array_position)/(e_constant) ' scale the target
      value
16
17  Do While (scaledData(i) < x1_target_value) And (i > 1)
18    i = i - 1 ' decrement to find value for i
19  Loop
20
21  x1_array_position = i ' assign X1 array position
22  x1_time_position = trigpt + (sampleres * x1_array_position) ' convert to time value
23  x1_vertical_position = scaledData(x1_array_position) ' calculate X1 vertical
      position
24  x2_vertical_position = scaledData(x2_array_position) ' calculate X1 vertical
      position
25  labelsposition = Cstr(x1_time_position) & "," & Cstr(x2_time_position) ' assign
      label position
26
27  app.Math.F4.ViewLabels = True ' turn label display on
28  app.Math.F4.LabelsPosition = labelsposition ' set position of labels
29  app.Math.F4.LabelsText = "X1" & "," & "X2" ' set text of labels
30
31  OutResult.Value = x2_time_position - x1_time_position ' time constant is reported
32
33  app.Measure.P2.Operator.Value = (x2_vertical_position / x1_vertical_position) '
      parameter 2 ratio computed
34
35  app.measure.p1.alias="RC Time Constant" ' parameter aliases for reporting
      calculated output values
36  app.measure.p2.alias="Y1/Y2 ratio" ' parameter aliases for reporting calculated
      output values
37  app.measure.p3.alias="Y1/Y2 percent" ' parameter aliases for reporting calculated
      output values
```

FIG. 6

```
1   e_constant = 0.367879441 ' decay constant that is user-selectable
2   midpoint_factor = 0.37' this value is defaulted to 0.37, and is the relative
       distance between X2min and X2max where X2mid is to be located
3   numSamples = App.Math.F1.Out.Result.Samples ' calculate the total number of sample
       points in the input waveform
4   scaledData = App.Math.F1.Out.Result.DataArray(True) ' scaledData is the input
       waveform on Function F1
5   trigpt = app.Math.F1.Out.Result.HorizontalOffset ' Determine the trigger point /
       horizontal offset
6   sampleres = app.Math.F1.Out.Result.HorizontalPerStep ' Determine the spacing
       between sample points
7   horzunits = app.Math.F1.Out.Result.HorizontalUnits ' Query for horizontal units (e.
       g. Seconds, etc.)
8   vertunits = app.Math.F1.Out.Result.VerticalUnits ' Query for vertical units (e.g.
       Volts, etc.)
9   x1_time_position = app.Cursors.StdCursOfF1.X1.Result.Value ' set the X1 time value
       to equal the user-selected manual cursor position
10  x2min_time_position = 0 ' set a default value for X2min, which is the leftmost
       waveform value which meets the criteria
11  x2mid_time_position = 0 ' set a default value for X2mid, which is a waveform value
       located between X2min and X2max which meets the criteria
12  x2max_time_position = 0 ' set a default value for X2max, which is the rightmost
       waveform value which meets the criteria
13  x1_array_position_raw = (x1_time_position - trigpt) / sampleres ' convert the time
       position to an array position
14  x1_array_position = Round(x1_array_position_raw,0) ' since the array position needs
       to be an integer, but was converted from a decimal time value, round it to be an
       integer array value
15  end_of_array = numSamples - 1 ' set the end of the array variable to be the
       rightmost sample point acquired
16  x2_max_array_position = end_of_array ' initial position of X2 max is rightmost
       sample point
17  x2_min_array_position = x1_array_position ' initial position of X2 min is cursor
       position
18  y2_target_value = scaledData(x1_array_position) * e_constant ' based on the Y1
       cursor position, the Y2 target value is established to be a certain percentage
       lower than the cursor's Y-value (by default, 37% down per the spec)
19
20  ' ******** section for auto-detecting whether the input pulse is a positive-going
       or negative-going pulse (determine pulse polarity)
21  wfm_max = -999 ' set negative starting max value, so that real waveform maximum
       will be determined
22  wfm_min = 999 ' set positive starting min value, so that real waveform minimum will
       be determined
23  array_position_of_wfm_max = 0 ' create variable to store the timing location of the
       max of the waveform
24  array_position_of_wfm_min = 0 ' create variable to store the timing location of the
       min of the waveform
25  array_position_of_wfm_peak = 0 ' applies to either max or min when labeling the
       waveform at the end
26  first_data_pt = scaledData(0) ' identify the Y-axis value of the first sample point
       in the waveform
27  pulse_polarity = 0 ' this should be set to either +1 or -1 when pulse polarity is
       detected
28  i = 0 ' counter position starts at left side of waveform
29  Do While (i < end_of_array) ' loop through the entire waveform to find the minimum
       and maximum waveform values
30    If scaledData(i) > wfm_max Then ' found a new max value
31       wfm_max = scaledData(i) ' replace the current max value with the new max
32       array_position_of_wfm_max = i
33    End If
34    If scaledData(i) < wfm_min Then ' found a new min value
35       wfm_min = scaledData(i) ' replace the current min value with the new min
36       array_position_of_wfm_min = i ' store time position
37    End If
38    i = i + 1 ' increment the current location
39  Loop ' continue
```

FIG. 7

```
1   If abs(wfm_max-first_data_pt) > abs(first_data_pt-wfm_min) Then ' magnitude of the
      different between the max and the start is greater than the magnitude of the
      difference between the start and the min
2     ' *** POSITIVE PULSE IS AUTO-DETECTED
3     pulse_polarity = 1 ' variable set to indicate that a positive pulse has been
        detected.  This is used later in the program for a trace label indicator.
4     array_position_of_wfm_peak = array_position_of_wfm_max ' used later for labeling
5     ' ******** section for locating X2min - looping from left to right
6     i = x1_array_position ' counter position starts at the cursor location
7     Do While (scaledData(i) > y2_target_value) And (i < end_of_array) ' loop from
        left to right starting at the cursor position to find the first occurance of a
        sample point which is 37% down
8       i = i + 1 ' increment the current location
9     Loop ' continue the loop
10    x2min_array_position = i ' the X2min position was found and is set to the current
         value of "i"
11    x2min_time_position = trigpt + (sampleres * x2min_array_position) ' convert from
        array index to a time value
12
13    ' ******** section for locating X2max - looping from right to left
14    i = end_of_array ' start at the rightmost sample point
15    Do While (scaledData(i) < y2_target_value) And (i > x1_array_position) ' loop
        from right to left, from the rightmost edge of the waveform toward the cursor
        position to identify X2max
16      i = i - 1 ' decrement the current location
17    Loop ' continue the loop
18    x2max_array_position = i ' the X2max position was found and is set to the current
         value of "i"
19    x2max_time_position = trigpt + (sampleres * x2max_array_position) ' convert from
        array index to a time value
20
21    ' ******** section for locating X2mid between X2min and X2max
22    If (x2max_array_position > (x2min_array_position + 1)) Then ' make sure that
        X2max is greater than X2min (consistency check to avoid errors)
23    '   x2mid_array_position_raw = (x2max_array_position + x2min_array_position)/2 '
        this code was previously used to set X2mid to be exactly halfway between X2min
        and X2max
24      x2mid_array_position_raw = (midpoint_factor * (x2max_array_position -
          x2min_array_position)) + x2min_array_position ' this sets X2mid to be 37%
          between X2min and X2max (or another factor user-selectable in the variable
          list at the top of this script)
25      x2mid_array_position = Round(x2mid_array_position_raw,0) ' round to the nearest
           integer array element
26    End If
27    x2mid_time_position = trigpt + (sampleres * x2mid_array_position) ' convert the
        array value to a time value
28
29    app.Measure.P5.View = True ' enable P5
30    app.Measure.P6.View = False ' disable P6
```

FIG. 8

```
1   Else ' *** Negative pulse is detected
2      pulse_polarity = -1 ' variable set to indicate that a negative pulse has been
          detected.  This is used later in the program for a trace label indicator.
3      array_position_of_wfm_peak = array_position_of_wfm_min ' used later for labeling
4
5      ' ******** section for locating X2min - looping from left to right
6      i = x1_array_position ' counter position starts at the cursor location
7      Do While (scaledData(i) < y2_target_value) And (i < end_of_array) ' loop from
          left to right starting at the cursor position to find the first occurance of a
          sample point which is 37% down
8         i = i + 1 ' increment the current location
9      Loop ' continue the loop
10     x2min_array_position = i ' the X2min position was found and is set to the current
          value of "i"
11     x2min_time_position = trigpt + (sampleres * x2min_array_position) ' convert from
          array index to a time value
12
13     ' ******** section for locating X2max - looping from right to left
14     i = end_of_array ' start at the rightmost sample point
15     Do While (scaledData(i) > y2_target_value) And (i > x1_array_position) ' loop
          from right to left, from the rightmost edge of the waveform toward the cursor
          position to identify X2max
16        i = i - 1 ' decrement the current location
17     Loop ' continue the loop
18     x2max_array_position = i ' the X2max position was found and is set to the current
          value of "i"
19     x2max_time_position = trigpt + (sampleres * x2max_array_position) ' convert from
          array index to a time value
20
21     ' ******** section for locating X2mid between X2min and X2max
22     If (x2max_array_position > (x2min_array_position + 1)) Then ' make sure that
          x2max is greater than x2min (consistency check to avoid errors)
23     '  x2mid_array_position_raw = (x2max_array_position + x2min_array_position)/2 '
          this code was previously used to set X2mid to be exactly halfway between X2min
          and X2max
24        x2mid_array_position_raw = (midpoint_factor * (x2max_array_position -
          x2min_array_position)) + x2min_array_position ' this sets X2mid to be 37%
          between X2min and X2max (or another factor user-selectable in the variable
          list at the top of this script)
25        x2mid_array_position = Round(x2mid_array_position_raw,0) ' round to the nearest
          integer array element
26     End If
27     x2mid_time_position = trigpt + (sampleres * x2mid_array_position) ' convert the
          array value to a time value
28
29     app.Measure.P5.View = False ' disable P5
30     app.Measure.P6.View = True ' enable P6
31
32  End If
```

FIG. 9

```
1  If abs(wfm_max-first_data_pt) > abs(first_data_pt-wfm_min) Then ' magnitude of the
      different between the max and the start is greater than the magnitude of the
      difference between the start and the min
2  ' ******** section for determining the Y-axis values of the four time points and
      the time position of the min or max peak
3  y1_vertical_position = scaledData(x1_array_position)
4  y2max_vertical_position = scaledData(x2max_array_position)
5  y2mid_vertical_position = scaledData(x2mid_array_position)
6  y2min_vertical_position = scaledData(x2min_array_position)
7  time_position_of_wfm_peak = trigpt + (sampleres * array_position_of_wfm_peak) '
      convert the array value to a time value
8
9  ' ******** section for labeling the location of the three computed (and one user-
      selected) time points on the waveform
10 labelsposition = Cstr(x1_time_position) & "," & Cstr(x2max_time_position) & "," & _
11                  Cstr(x2mid_time_position) & "," & Cstr(x2min_time_position)& "," &
                    _
12                  Cstr(time_position_of_wfm_peak) ' Cstr converts calculated
                       numerical values into character text strings used to display as
                       trace label text
13
14 'If (pulse_polarity = 1) Then ' ESD pulse is positive
15  ' labelstext = "X1 (positive pulse detected)"
16 'Else If (pulse_polarity = -1) Then ' ESD pulse is negative
17  '  labelstext = "X1 (negative pulse detected)"
18 'Else ' A problem has occurred
19  '  labelstext = "X1 (pulse polarity not detected)" ' error handling
20 'End If
21 labelstext = "X1" & "," & "X2_max" & "," & "X2" & "," & "X2_min" & "," & "Peak" '
      the actual text used for the labels which appear on the waveform
22
23 app.Math.F1.ViewLabels = True ' turn label display on
24 app.Math.F1.LabelsPosition = labelsposition ' set position of labels, based on the
      array of label positions defined above
25 app.Math.F1.LabelsText = labelstext ' set text of labels, based on the array of
      label text strings defined above
26
27 app.Measure.P1.Operator.Value =  x2mid_time_position - x1_time_position ' time
      constant is reported as a parameter value
28 app.Measure.P2.Operator.Value = 100*(y2min_vertical_position / y1_vertical_position
      ) ' report the difference in the calculated vertical Y-axis value of the
      horizontal time point X2max relative to the Y-axis value corresponding to the
      user-selected X1 cursor value
29 app.Measure.P3.Operator.Value = 100*(y2mid_vertical_position / y1_vertical_position
      ) ' report the difference in the calculated vertical Y-axis value of the
      horizontal time point X2mid relative to the Y-axis value corresponding to the
      user-selected X1 cursor value
30 app.Measure.P4.Operator.Value = 100*(y2max_vertical_position / y1_vertical_position
      ) ' report the difference in the calculated vertical Y-axis value of the
      horizontal time point X2min relative to the Y-axis value corresponding to the
      user-selected X1 cursor value
31
32 app.measure.p1.alias="RC Time Constant" ' use parameter aliases to override the
      parameter names
33 app.measure.p2.alias="Y1/Y2_min ratio" ' use parameter aliases to override the
      parameter names
34 app.measure.p3.alias="Y1/Y2 ratio" ' use parameter aliases to override the
      parameter names
35 app.measure.p4.alias="Y1/Y2_max ratio" ' use parameter aliases to override the
      parameter names
```

FIG. 10

RC TIME CONSTANT MEASUREMENT

CROSS REFERENCE TO RELATED APPLICATIONS

This application claims the benefit of U.S. Provisional Application No. 62/381,229, filed Aug. 30, 2016, entitled RC TIME CONSTANT MEASUREMENT, the entire contents of which are incorporated herein by reference.

TECHNICAL FIELD

This technology relates to mechanisms to determine the resistive-capacitive (RC) time constant calculation of an electrostatic discharge (ESD).

BACKGROUND

ESD testing is sometimes a requirement for products that contain electronic components. Static electricity can commonly afflict microelectronic circuits, and the electrical surge produced by such static electricity can result in unpredictable circuit behavior. Electronic components are designed to have, and are tested to determine, a certain level of immunity to ESD. The tests address a variety of conditions that the components may encounter during packaging, handling, assembly, service, and intended operation. As such, ESD immunity is sometimes measured and tested to ensure product quality. This testing can involve applying an ESD pulse to a circuit.

Prior to applying an ESD pulse to a circuit to test that circuit, an ESD simulation pulse may be characterized to determine aspects of the pulse, including the magnitude and timing measurements of the incident ESD pulse. One of the most challenging measurements for ESD characterization has been the RC Time Constant measurement. A traditional method of determining the RC Time Constant has been to manipulate oscilloscope cursors on an electronic representation of a waveform that presents a recorded ESD signal, and to continually manipulate the electronic representation of the waveform shape and to continually reposition the oscilloscope cursors until the measurement criteria is met. This approach, however, is time consuming and can be inaccurate because of the disparity between the sampled data that comprises the ESD pulse and the pixelated representation of that data that is selected through user manipulation of the oscilloscope cursors.

International standard ISO10605:2001(E) standard (test methods for electrical disturbances from electrostatic discharge for road vehicles) describes a number of test specification requirements. Many of these test criteria are qualified through simple numerical parameter measurements. For example, a parametric measurement of the ESD pulse rise time can be obtained automatically using existing oscilloscope features by setting adjustable threshold levels on the rise time parameter to account for the characteristic exponential decay shape of an ESD pulse. Some specification requirements, however, cannot be measured using traditional oscilloscope parameters. An example such measurement is the RC time constant for an air discharge ESD simulator. The ISO10605:2001 RC time constant measurement describes a single event discharge waveform which must meet the acceptance criteria time of 600 ns±130 ns from the discharge between two sample points, having an amplitude difference of 63.2120559% along the discharge curve when using a 330 pF probe and 300 ns±60 ns from the discharge between two sample points which have an amplitude difference of 63.2120559% along the discharge curve for a 150 pF probe [1]. Note that an amplitude difference of 63.2120559% corresponds to an amplitude ratio of 0.367879441.

Determining the RC time constant measurement under such criteria is especially challenging due to measurement inaccuracy contributions from human error and error originating from the measurement system. Presently, oscilloscopes are not equipped to address this RC time constant measurement. Therefore, measurements rely on operators manually placing the cursors, which introduces multiple forms of inaccuracy. A contributor to cursor inaccuracy is the resolution of cursor position inherent to all oscilloscopes, in which the precise time position of a placed cursor is often only specified to be within 2% of the time coordinate reported by its position. The cursor placement problem is exacerbated by manual placement of the cursor, which introduces arbitrary error into the selected time coordinate, and which results in measurement bias. In addition to the compounding error described above, a lack of statistical significance occurs when these measurements are obtained by a human instead of being performed according to an automated mechanism, which results in a loss of both precision and accuracy. Moreover, engineering personnel, equipment, and test facility time is consumed when individuals attempt to perform such measurements manually.

SUMMARY OF THE INVENTION

A new mechanism has been developed to accurately characterize the RC time constant of a decaying ESD pulse. For such a timing pulse, certain y-axis measurements that meet specified criteria have to be met, and the corresponding times for those criteria are measured. For example, the y-axis measurements can be selected for two different data points, such that the relationship between the second data point and the first datapoint is such that $y_2 \approx 0.367879441 \cdot y_1$. The corresponding x-axis times are then selected. Based on the determination of these timing positions, one or more characteristics of the ESD pulse may be obtained. One such measurement is the RC time constant, which is calculated as the timing difference between the two times, which are referred to in this disclosure as the start time and end time.

A first mechanism to determine the RC time constant involves sampling an ESD pulse to identify its characteristics, automatically selecting a fixed end time, identifying the corresponding y-axis value, and iterating backward in time through sampled data points of the waveform (i.e., in reverse time orientation) to determine a y-axis value that satisfies the appropriate y-axis relationship, and thereafter to selecting the corresponding $x_1$ starting position for the calculated start time.

A second mechanism to determine the RC time constant involves sampling an ESD pulse to identify its characteristics, receiving user input that selects a particular start time, and iterating forward in an array of sampled values for the ESD pulse until a two different $y_2$ values are identified that specify the first and last values in the ESD pulse that satisfied the appropriate y-axis relationship. The corresponding x-axis values of these data points are identified and from them the calculated end time, and therefore the RC time constant is determined.

A third mechanism is to determine multiple pairs of $x_1$ and $x_2$ time values that form first, second, third, etc. timing pairs for which the timing relationship criteria is met, and then select an optimal timing pair according to a best fit method.

As will be seen, the mechanisms described in this disclosure are able to solve for the RC time constant of virtually any ESD pulse wave shape. Moreover, the mechanisms described in this disclosure are operable on either ESD pulse polarity. Moreover, the mechanisms described in this disclosure can refine the sampled measurements of the ESD pulse using digital filtering and curve fitting to increase the signal-to-noise ratio (SNR) of the sampled data, therefore improving an accuracy of sampling time detection. Doing so results in improvements to time coordinate placement, measurement precision, and ultimately determination of the RC time constant.

As additional description to the embodiments described below, the present disclosure describes the following embodiments.

Embodiment 1 is an electronic-implemented method to characterize a device under test. The method comprises receiving, by an electronic test instrument, an electrical waveform from the device under test. The method comprises sampling, by the electronic test instrument, the electrical waveform to generate an array of data values that represent a magnitude of an electrical characteristic of the electrical waveform at corresponding points in time. The method comprises presenting, by the electronic test instrument, a representation of the electrical waveform on a display of the electronic test instrument. The method comprises receiving, by the electronic test instrument, user input that selects a particular position of the electrical waveform that is presented on the display of the electronic test instrument. The method comprises identifying, by the electronic test instrument, a starting time that corresponds to the particular position that was selected by user input. The method comprises identifying, by the electronic test instrument, a starting data value in the array of data values that corresponds to the particular position that was selected by user input. The method comprises identifying, by the electronic test instrument, a decayed value that identifies a level of the starting data value decayed by a particular amount. The method comprises analyzing, by the electronic test instrument, the array of data values to identify multiple data values in the array of data values that correspond to the decayed value. The method comprises determining, by the electronic test instrument, an ending time using the multiple data values in the array of data values that correspond to the decayed value. The method comprises determining, by the electronic test instrument, a decay time between the starting time and the ending time. The method comprises presenting, by the electronic test instrument and on a display device, the determined display time.

Embodiment 2 is the electronic-implemented method of embodiment 1, wherein receiving the user input that selects the particular position of the electrical waveform includes receiving user input that moves a vertical-line cursor horizontally across the display of the electronic test instrument until the vertical-line cursor rests at a position that corresponds to the starting time.

Embodiment 3 is the electronic-implemented method of embodiment 1, wherein presenting the representation of the electrical waveform on the display of the electronic test instrument includes generating a pixel-based representation of the electrical waveform based on the array of data values, with a magnitude value for at least one pixel being different than any corresponding data value in the array of data values.

Embodiment 4 is the electronic-implemented method of embodiment 1, wherein: the particular value is 36.8%; and the decayed value identifies a level of the starting value that has decayed by 36.8%.

Embodiment 5 is the electronic-implemented method of embodiment 1, wherein presenting the decay time on the display device includes presenting the decay time on the display of the electronic test instrument.

Embodiment 6 is the electronic-implemented method of embodiment 1, wherein sampling the electrical waveform to generate the array of data values that represent the magnitude of the electrical characteristic of the electrical waveform at the corresponding points in time includes generating an array of amperages of the electrical waveform at the corresponding points in time.

Embodiment 7 is the electronic-implemented method of embodiment 1, wherein analyzing the array of data values to identify multiple data values in the array of data values that correspond to the decayed value includes: (i) identifying, by the electronic test instrument, a first-encountered data value that has the decayed value moving forward from the starting data value, and (ii) identifying, by the electronic test instrument, a last-encountered data value that has the decayed value moving forward from the starting data value.

Embodiment 8 is the electronic-implemented method of embodiment 7, wherein identifying the last-encountered data value that has the decayed value moving forward from the starting data value includes identifying a first-encountered data value during a traversing of the data values in the array of data values from an end of the array of data values moving forward.

Embodiment 9 is the electronic-implemented method of embodiment 7, wherein determining the ending time using the multiple data values includes identifying an ending time that has a designated time relationship between a time of the first-encountered data value and a time of the last-encountered data value.

Embodiment 10 is the electronic-implemented method of claim 9, wherein the designated time relationship between the time of the first-encountered data value and the time of the last-encountered data value is 36.8% of time between the time of the first-encountered data value and the time of the last-encountered data value.

Embodiment 11 is an electronic test instrument. The instrument comprises lead inputs to receive an electrical waveform from a device under test. The instrument comprises one or more samplers to sample an electrical waveform. The instrument comprises a display to present a display of the electrical waveform. The instrument comprises one or more processors. The instrument comprises one or more non-transitory computer-readable devices including instructions that, when executed by the one or more processors, cause the electronic test instrument to perform various operations. The operations include generating, employing the one or more samplers, an array of data values that represent a magnitude of an electrical characteristic of the electrical waveform at corresponding points in time. The operations include presenting a representation of the electrical waveform on the display of the electronic test instrument. The operations include receiving user input that selects a particular position of the electrical waveform that is presented on the display of the electronic test instrument. The operations include identifying a starting time that corresponds to the particular position that was selected by user input. The operations include identifying a starting data value in the array of data values that corresponds to the particular position that was selected by user input. The operations include identifying a decayed value that identifies a level of the starting data value decayed by a particular amount. The operations include analyzing the array of data values to identify multiple data values in the array of data values that correspond to the decayed value. The operations include determining an ending time using the multiple data values in the array of data values that correspond to the decayed value. The operations include determining a decay time between the starting time and the ending time. The operations include presenting, on a display device, the determined display time.

It is another object of the technology described in this disclosure to improve the RC time constant measurement capabilities of an oscilloscope. The mechanisms described herein can generate more accurate RC time constant measurement calculations than previous mechanisms, can do so more quickly, and can provide various different results using different calculation mechanisms, with all of these results not having been previously obtainable using oscilloscope cursor manipulation. The described technology can further accommodate inverted ESD pulses. Still other objects and advantages of the technology described herein will be apparent from the specification and drawings.

BRIEF DESCRIPTION OF THE DRAWINGS

For a more complete understanding of the technology, reference is made to the following description and accompanying drawings, in which:

FIG. 6 shows an example set of instructions for use in the fixed endpoint mechanism for determining the RC time constant;

FIG. 7 shows an example set of instructions for use in the minimum/maximum endpoint mechanism for determining RC time constant;

FIG. 8 shows an example set of instructions for use when a positive ESD pulse shape is detected;

FIG. 9 shows an example set of instructions for use when a negative ESD pulse shape is detected;

FIG. 10 shows an example set of instructions for determining time coordinate y-axis values and pulse labeling.

DETAILED DESCRIPTION OF THE PREFERRED EMBODIMENTS

Figure 2:
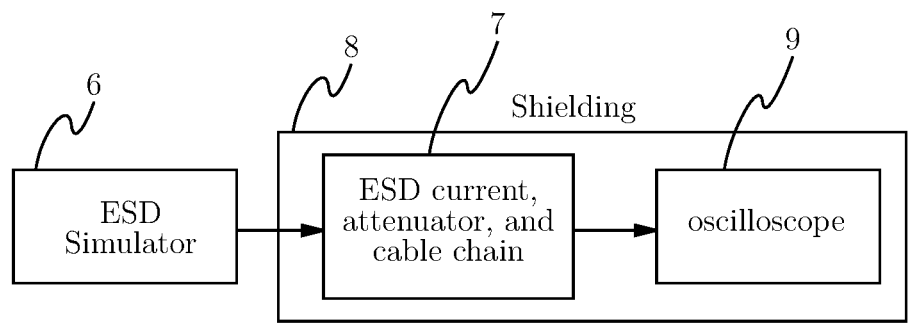
FIG. 2 shows a hardware configuration used during measurement.

An example hardware configuration used to measure an RC time constant includes an ESD generator, a vertical calibration plane, and a current target. As an example, a current shunt target may be connected to a 20 dB attenuator and a double-shielded cable which then terminates into a 6 dB attenuator that is mounted to the input of an oscilloscope, as shown in FIG. 2. This figure shows an ESD simulator [6], which is produces an actual ESD pulse. The ESD simulator is connected to Fixturing [7], which includes ESD current passing there through, an attenuator, and a cable chain. The Fixturing [7] is then connected to an Oscilloscope [9]. The Oscilloscope [9] and Fixturing [7] are encased in Shielding [8].

Figure 1:
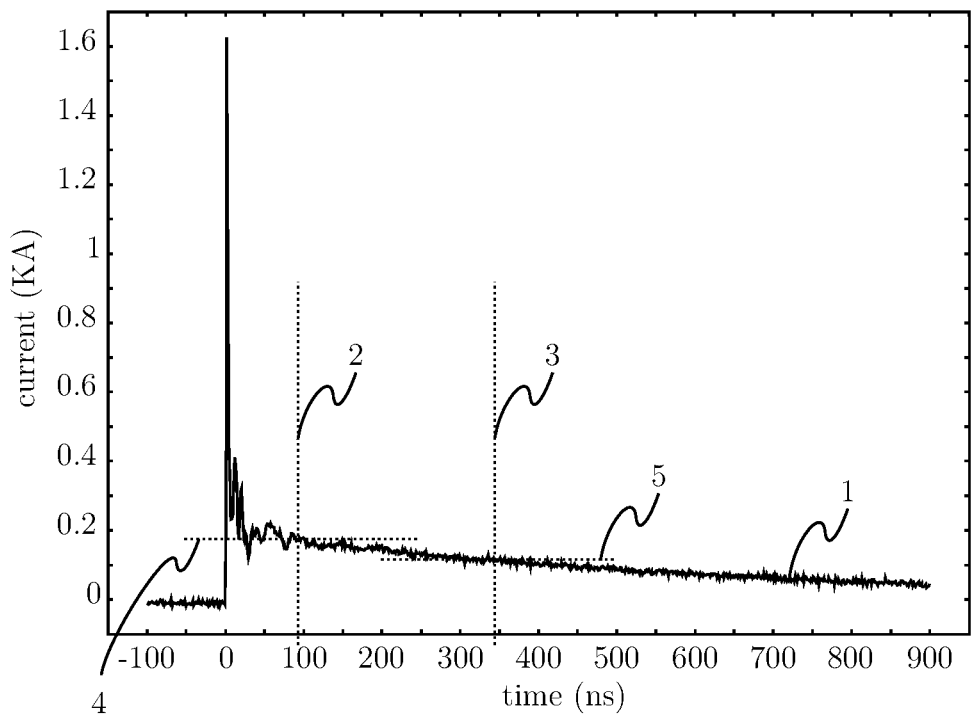
FIG. 1 shows an ESD pulse to be measured.

FIG. 1 shows a display by an acquisition display device (e.g., an oscilloscope) of an ESD pulse, and this disclosure describes measurement of the RC time constant of that pulse. A goal here is to identify sample points located on the ESD current waveform [1] by selecting coordinate positions $x_1$ and $x_2$ corresponding to a start time [2] and an end time [3] within the stable region of the ESD pulse, such that the vertical difference between $y_1$ and $y_2$ (corresponding to a current at start time [4] and current at end time [5], and thus the ratio of current at start time [4] and current at end time [5], represents a decline of 63.2120559%, or other values which are determined by a standard specification procedure.

To best describe the algorithm in formulaic terms, this disclosure typically uses coordinate terms such as $x_1$ and $x_2$ to describe array element positions, while reserving terms such as start time [2] and end time [3] to describe time positions, as a method to distinguish array positions used in the search algorithms from timing goals used in the algorithm description. In a manual determination of the RC time constant, the process of determining $x_1$ and $x_2$ timing positions, corresponding to a current at start time [4] and current at end time [5], involves a series of arbitrary decisions made by a live operator, starting with the initial timing placement of either the $x_1$ or $x_2$ cursor, and ending with a series of iterative adjustments of the cursors along the time axis until a matched pair of cursor timing positions produces the prescribed percentage difference in decayed amperage. Because the decay, slope and shape of each subsequent ESD pulse varies from each acquisition to the next, this becomes a time-consuming and error-prone process, especially as it is repeated for each subsequent ESD current waveform [1] that is acquired. The mechanisms described herein outperform manual calculation using cursors in accuracy, speed, and repeatability.

A first mechanism to determine the RC time constant includes the measurement device automatically selecting a fixed endpoint (i.e., without user input selecting the endpoint after acquisition of the ESD signal to be analyzed). This mechanism is illustrated in the ESD display shown in FIG. 3. Using a fixed endpoint, the measurement device sets an endpoint $x_2$ one division from the end of the waveform and records the values for the corresponding coordinate. The choice of one division is selected based on a combination of the time per division selected and the decay time of an ESD pulse, although other fixed endpoints may be used.

The measurement device then loops backward in time toward the transient event. The search orientation for timing position $x_1$ corresponding to the calculated start time [10] is in the negative timing direction as indicated by reverse time orientation [14]. The first voltage sample reading which meets the search criteria (a factor of approximately 0.367879441 between $y_2$ and $y_1$, corresponding to the ratio between current at a calculated start time [12] and a current at the fixed end time [13]) becomes the $x_1$ time position calculated start time [10]. The measurement device then recomputes the ratio of $y_1/y_2$, the ratio between the current at the calculated start time [12] and the current at the fixed end time [13]. That ratio is then reported as a continuously updated parameter constant within the measurement parameter table, potentially matching the specifications given in the measurement standard.

Figure 3:
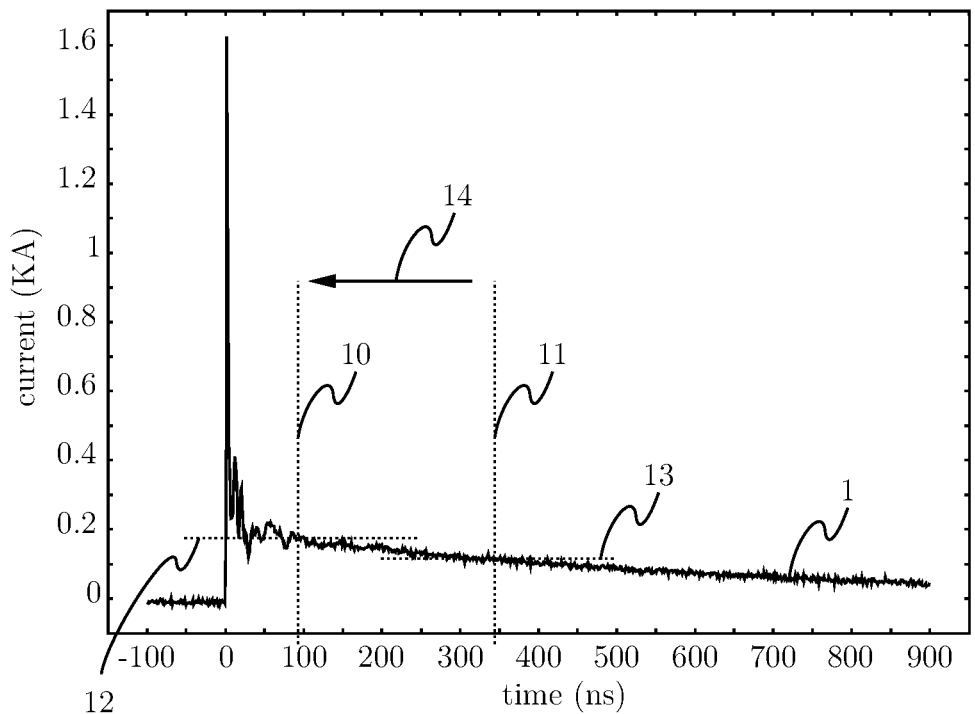
FIG. 3 illustrates a fixed endpoint mechanism to determine an RC time constant.

An example amount of total time to perform the measurement is approximately 100 milliseconds. An improvement in accuracy over manual cursor manipulation results from the measurement device tracking actual acquired sample point values in the waveforms rather than cursor traversing pixelated values of compacted data. The example illustrated in FIG. 3 is one implementation provided for illustrative purposes and is not limiting. The determination of $x_1$ and $x_2$ timing positions corresponding to calculated start time [10] and fixed end time [11] can be calculated using multiple methods.

Sample instructions used to implement the above-described fixed endpoint method are provided in FIG. 6. Line 1 in FIG. 6 includes instructions that request the measurement device to establish a COM object handle used to send commands to the measurement instrument, an Oscilloscope [9]. Line 2 sets the number of samples variable based on the number of samples detected in the acquisition. Line 3 reads the acquired data sample points into an array. Lines 5-8 read instrument settings information such as the trigger point location, the sample resolution, horizontal units, and vertical units. Line 9 is blank. Lines 11-12 determine position information for the waveform. Line 12 is blank. Line 13 establishes a decay constant, which may be modified later to adapt to various standard specifications. Line 14 establishes the array counter position. Line 15 scales the target value. Line 16 is blank. Lines 17-19 continue to loop while the scaled data is less than the target value and the counter position has not yet reached the end of the waveform. Line 20 is blank. After exiting this loop, lines 21-25 set the array position to the last counter increment, convert the incrementer to a time value, determine the $x_1$ and $x_2$ timing positions corresponding to calculated start time [10] and fixed end time [11], and place a label corresponding to each of the calculated start time [10] and fixed end time [11]. Line 26 is blank. Lines 27-29 write the labeling information to the display. Line 30 is blank. Lines 31 and 32 report the RC time constant value. Line 33 calculates the ratio of $y_1/y_2$, the ratio between current at calculated start time [12] and current at fixed end time [13], and that ratio is reported as a continuously updated parameter constant within the measurement parameter table. Line 34 is blank. Lines 35-37 provide parameter aliases which allow the reported parameter table results to display desired output units and match the specification terminology.

Figure 4:
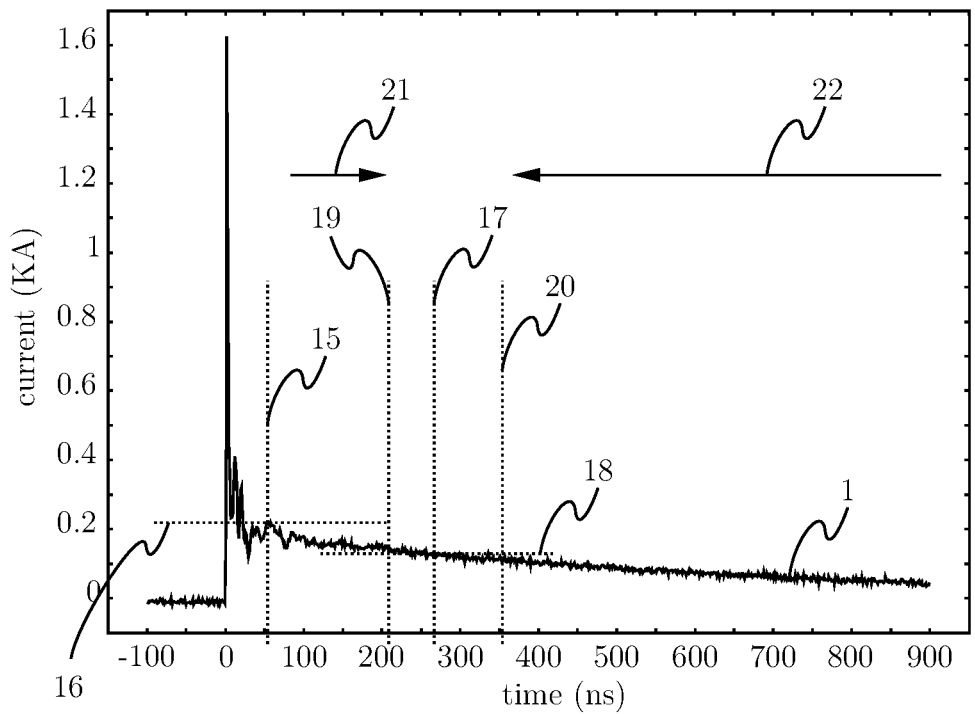
FIG. 4 illustrates a minimum/maximum endpoint mechanism to determine an RC time constant.

A second mechanism to determine the RC time constant involves the measurement device prompting a user to provide user input to select $x_1$ as the selected start time [15], which is a mechanism that is illustrated in FIG. 4. For example, an operator can sight an opportune starting position along the ESD pulse decay curve to place the $x_1$ timing position at the selected start time [15], and can provide user input that moves a cursor of an oscilloscope to designate [15] as the start time. Since multiple values of $x_2$ have the potential for meeting the RC time constant measurement requirement, a range of $x_2$ values are selected. Specifically, the measurement device initially selects two values of $x_2$ for the end time: the minimum end time [19] and the maximum end time [20]. Each of these end times may meet the criteria such that the ratio of current at selected start time [16] and current at the calculated end time, the ratio of selected $y_1/y_2$, represents a decay ratio of 0.367879441, or other values which are determined by a standard specification procedure.

For example, in the trailing portion of an ESD pulse decay curve, due to signal bounce, quantization noise and other factors, the waveform may traverse the criterion threshold line several times before ultimately settling below it. The first instance in which the ESD pulse decay curve crosses the threshold will be identified as $x_{2min}$, the absolute minimum valid value meeting the $x_2$ measurement criteria while searching in the minimum end time location orientation [21]. Likewise, by searching the waveform array backward in time, corresponding to maximum end time location orientation [22], from largest to smallest time values, the first threshold crossing encountered in the ESD pulse decay curve will be identified as $x_{2max}$, the absolute maximum valid value meeting the $x_2$ measurement criteria.

In some examples, a final $x_2$ value is selected at 63.2120559% the distance between $x_{2min}$ and $x_{2max}$. This final value of $x_2$ (corresponding to the calculated end time [17]) is then used to determine the RC time constant measurement result. In other examples different values for $x_2$ may be selected. For example, a value at a different pre-determined distance between $x_{2min}$ and $x_{2max}$ may be selected. In some implementations, a weighted location of the various $x_2$ values may be selected, or other analysis performed using all or a certain amount of the $x_2$ values may be performed.

An example set of instructions that are used to implement this placed $x_1$ position measurement mechanism is provided in FIG. 7, FIG. 8, FIG. 9, and FIG. 10, in which the identification and management of both positive and negative pulse polarities is handled by the decision processes of FIG. 8 and FIG. 9.

FIG. 7 shows the algorithmic implementation for determining an optimal final $x_2$, calculated end time [17] value based on selected $x_1$, selected start time [15], and located $x_{2min}$ and $x_{2max}$, minimum end time location orientation [21] and maximum end time location orientation [22], using an input selection method. Line 1 of FIG. 7 defines the decay constant. Line 2 provides a user-selectable midpoint which is located between $x_{2min}$ and $x_{2max}$ as a percentage basis. Lines 3-8 set the number of sample points, scaled data values, trigger point, sample resolution, horizontal units, and vertical units to the desired numerical values. Lines 9-12 set default values for $x_1$, the calculated start time [10], calculated end time [17], $x_{2min}$ and $x_{2max}$, the minimum end time [19] and maximum end time [20], and determine $x_2$, the calculated end time [17]. Line 13 converts the time position to an array position, and line 14 rounds that value to an integer array. Line 15 sets the end of the array variable to be the rightmost sample point acquired. Line 16 sets the initial position of $x_{2max}$ to be the rightmost sample point. Line 17 sets the initial position of $x_{2min}$ to be the cursor position. Line 18 establishes the $y_2$ target value to be a certain percentage lower than the cursor's Y-axis value (by default, a 63.2120559% difference per the standard specification). Line 19 is blank. Lines 20-39 loop through the waveform to determine whether the pulse under consideration is a positive-going pulse or a negative-going pulse, with lines 19-28 setting up variables used in the decision process, and lines 29-39 looping through the waveform data array to determine the exact locations of the minimum and maximum values, which are compared with the starting values in the waveform to ascertain polarity.

FIG. 8 shows instructions to perform when the measurement device detects a positive ESD pulse shape. Lines 1 and 2 detect the presence of a positive-going pulse by comparing the first acquired sample point and the minimum-valued sample point in the acquired waveform data array. At line 3, if a positive pulse has been detected, then the pulse polarity variable is set to 1. This is used later for a trace label indicator. Line 4 sets the array position of the waveform peak to be the array position of the waveform maximum, which is used later for labeling purposes. Lines 5 and 6 set the counter position to start at the cursor location, selected start time [15]. Lines 7 through 9 loop through the data array to locate the first occurrence of a sample point which is 0.367879441 of the amperage of (or a 63.2120559% decrease from) the amplitude at the selected start time [15]. Line 10 sets the $x_{2min}$ array position to be the current location of the increment counter. Line 11 sets the $x_{2min}$ time position to be the sum of the trigger point position added to the product of the sample resolution and the $x_{2min}$ array position. Line 12 is blank. Lines 13-14 set the increment variable equal to the start of the rightmost sample point in the acquired array. Lines 15-17 loop from right to left, from the rightmost edge of the waveform toward the cursor position to identify the minimum end time [19], decrement the current location of $x_{2max}$, and continue the loop. Line 18 sets the $x_{2max}$ array position equal to the current value of the increment counter. Line 19 sets the maximum end time [2] time position equal to the trigger point location added to the product of the sample resolution and $x_{2max}$ array position, converting the value from an array index to a time value. Line 20 is blank. Lines 21-22 determine a calculated end time [17] between minimum end time [19], and maximum end time [20] based on a determination that $x_{2max}$ is larger than the sum of 1 plus $x_{2min}$. This is performed as a consistency check to avoid an inequality error. Line 23 is currently commented out, but can be re-enabled for the purpose of setting $x_2$ to be exactly halfway between $x_{2min}$ and $x_{2max}$. Line 24 sets the $x_2$ array position to be equal to the user-defined midpoint factor multiplied by the difference of the $x_{2min}$ and $x_{2max}$, and sums this product with $x_{2min}$. This sets the $x_2$ array position to be a 0.367879441 ratio between (or a 63.2120559% decrease from) $x_{2min}$ and $x_{2max}$ (or another factor user-selectable in the variable list at the top of the script). Line 25 sets the $x_2$ array position equal to an integer equivalent of the $x_2$ decimal value, rounded to the nearest integer array element. Line 26 ends the If statement. Line 27 converts the $x_2$ array value to a time value calculated end time [17], by summing the trigger point value with the product of the sample resolution and $x_2$ array position. Line 28 is blank. Lines 29-30 enable the measurement parameter view for parameter 5 while disabling the measurement parameter view for parameter 6.

FIG. 9 shows instructions to perform when the measurement device detects a negative ESD pulse shape. Line 1 is an else statement corresponding to the detection of a negative-polarity pulse which did not meet the definition criteria for a positive-going pulse. Line 2 sets the pulse polarity flag equal to negative 1, and this pulse polarity flag is used later in the program for a trace label indicator. Line 3 sets the array position of the waveform peak equal to the array position of the waveform minimum, which is used later for labeling. Line 4 is blank. Lines 5 and 6 set the array index equal to the $x_1$ array position, setting the counter position at the cursor location. Lines 7-9 are a do-while loop which checks that the scaled data at the counter index is less than the $y_2$ target value and that the array index has not yet reached the end of the array, looping from left to right, starting at the cursor position to find the first occurrence of a sample point which is a 63.2120559% decrease from $y_1$. Line 10 sets the $x_{2min}$ array position equal to the counter increment. Line 11 sets the minimum end time [19] time position equal to the trigger point value summed with the product of the sample resolution and the $x_{2min}$ array position, converting from an array index to a time value. Line 12 is blank. Lines 13-14 begin the section for locating $x_{2max}$ by looping from right to left, and setting the counter to the end of the array at the rightmost sample point. Lines 15-17 form a while loop in which the scaled data at the index is checked against the $y_2$ target value to ensure that the counter is not greater than the $x_1$ array position. The counter loops from right to left, starting at the rightmost edge of the waveform and moving toward the selected start time [15] cursor position to identify $x_{2max}$. Line 18 sets the $x_{2max}$ array position equal to the counter increment. Line 19 sets the $x_{2max}$ time position equal to the trigger point summed with the product of the sample resolution and $x_{2max}$ array position, converting from an array index to a time value. Line 20 is blank.

Lines 21-22 check that the $x_{2max}$ array position is greater than the $x_{2min}$ array position added to 1, in order to ensure that $x_{2max}$ is greater than $x_{2min}$, which is a consistency check to avoid errors. Line 23 is commented out but can be re-enabled for the purpose of setting $x_2$ to be exactly halfway between $x_{2min}$ and $x_{2max}$. Line 24 sets the $x_2$ array position to be equal to the user-defined midpoint factor multiplied by the difference of the $x_{2min}$ and $x_{2max}$, and sums this product with $x_{2min}$. This sets the $x_2$ array position to be a 63.2120559% decrease between $x_{2min}$ and $x_{2max}$ (or another factor user-selectable in the variable list at the top of the script). Line 25 sets the $x_2$ array position equal to an integer equivalent of the $x_2$ decimal value, rounded to the nearest integer array element. Line 26 ends the If statement. Line 27 converts the $x_2$ array value to a time value calculated end time [17], by summing the trigger point value with the product of the sample resolution and $x_2$ array position. Line 28 is blanks. Lines 29-30 enable the measurement parameter view for parameter 5 while disabling the measurement parameter view for parameter 6. Line 31 is blank. Line 32 ends the If statement corresponding to the check for pulse polarity.

FIG. 10 shows instructions for determining time coordinate y-axis values and pulse labeling. Lines 1 and 2 check if the absolute value of the difference between the maximum waveform value and the first data sample point is greater than the absolute value of the difference between the first data sample point and the waveform minimum value. Lines 3-6 set the vertical position of y-axis values for $y_2$ max, min, and mid. Line 7 sets the time position of the waveform peak. Line 8 is blank. Lines 9-12 set the timing label positions. Line 13 is blank. Lines 14-21 check if the pulse polarity had been previously determined to be positive or negative, and sets the label text appropriately. Line 22 is blank. Lines 23-25 enable the trace labels. Line 26 is blank. Lines 27-30 establish the pulse parameter output values and displays them in the measurement parameter table. Line 31 is blank. Lines 32-35 use parameter aliases to override the measurement parameter names.

Figure 5:
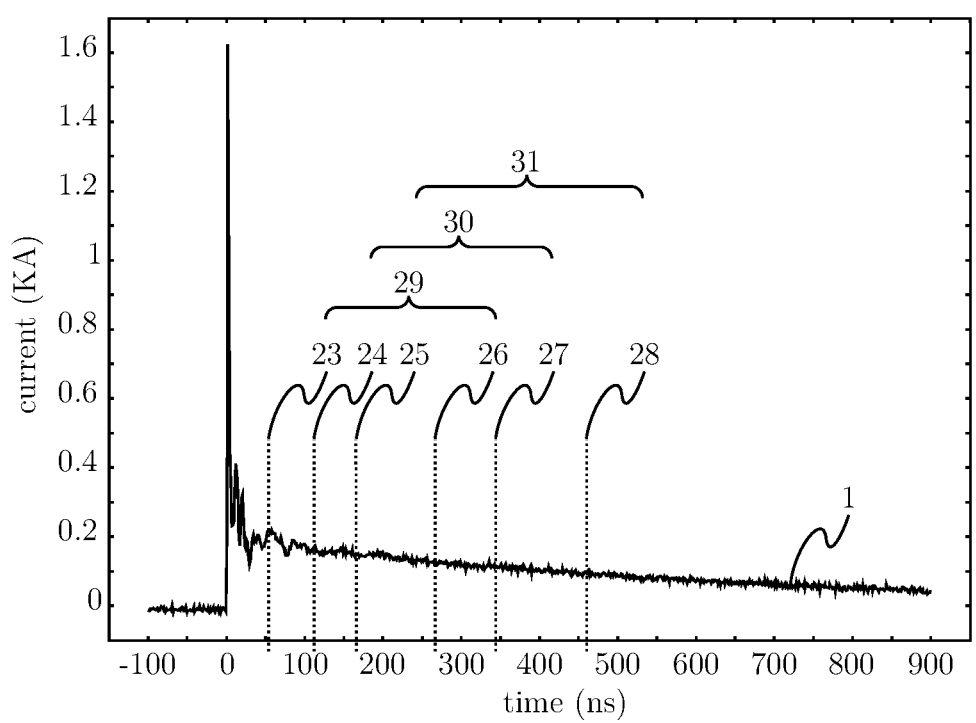
FIG. 5 illustrates a matched timing pair mechanism to determine an RC time constant.

A third mechanism to identify a suitable calculated start time [10] and a suitable calculated end time [17], and therefore $x_1$ and $x_2$ timing positions, is to first identify the set of all suitable matched pair determinations, then sort the matched pairs to identify one optimal matched pair. An illustration of this mechanism is shown in FIG. 5. In this case, a first timing pair [29], a second timing pair [30], a third timing pair [31], etc., are selected corresponding to $x_{1N}$ and $x_{2N}$ pairs of timing values which meet the decay criteria. Then, from among the set of N selected values, one pair of timing values, for example the first end time [26] and the second end time [27], $\{x_{1B}, x_{2B}\}$ are selected to calculate the final RC time constant measurement result. The measurement device may also fit values of the decay curve to an idealized model rather than to the raw data calculation shown here. This fit would proceed in a similar manner with the values that were fitted to obtain a fit to an ideal model.

Because the choice of $x_1$ is important, instead of relying on the operator to determine the initial time value such as first start time [23], $x_{1A}$, in which the value chosen may correspond to an inopportune feature such as a local peak or a local trough, for example, an optimal time value for $x_{1N}$ may be determined by the measurement device according to stored instructions by determining a region of stability defined by a specified criteria. Using a simple hysteresis band may not be sufficient to determine stability since the pulse may also be decaying as a function of time. Therefore, a weighted or scaled hysteresis band may be used. Once an array of valid $x_{1N}$ values are determined through the weighted hysteresis band, then all possible $x_{2N}$ values in the waveform which meet the stability requirements of $y_{1N}$ and the decay ratio requirements of $y_{2N}$ may be considered. Time pairs closer to the initial stable region may be considered more reliable since pair combinations further in time will be subject to decreasing SNR as the waveform decays further toward the measurement noise floor and is dominated by noise on a percentage basis. Therefore, time pairs are preferred closer to the first stable region following the transient response, as the most reliable values. The measurement device can bracket a portion of the waveform which meets a criteria of stability, identify an initial region of stability following the transient response of system, consider all possible time pairings, and identify the optimal time pair while also anticipating the time decay and noise effects as a function of distance from the initial ESD pulse event.

As an example of the above described method, the system can perform a front-to-back analysis of the signal, a back-to-font analysis of the signal, or both to identify corresponding regions of stability. For each identified region of stability, the system can identify one or more starting points (for a front-to-back analysis) or ending points (for a back-to-front analysis) located within the region of stability. The starting and ending points may be all such values that meet certain criteria (e.g., all values falling within the band, a sample of values falling within the band, and/or the most stable values falling within the band), and an array of such values may be stored. Then, for each identified starting/ending point, the system may find the one or more corresponding ending/starting points to identify one or more paired combinations for each identified point. According to the first and second methods described in this disclosure, there may exist multiple paired combinations for each starting/ending point. In sum, the system may identify multiple paired combinations that result from determination of suitable regions of stability, identification of points within such regions of stability, and then identification of paired combinations for each such identified point. Further analysis can select particular paired combination from this group of identified paired combination (e.g., a median value or a value at a certain location within the group of identified paired combinations). In some examples, mathematical processing of the paired combinations is performed (e.g., by averaging or otherwise combining the determined RC constant for all paired combinations or a subset thereof, such as a subset that excludes outlier values).

It will thus be seen that an efficient and useful apparatus for the ESD RC time constant measurement has been demonstrated. Note that the inventors have anticipated various other features of the RC time constant measurement. One is the ability to apply curve fitting to determine the optimal values of calculated start time [10] and calculated end time [17]. Another consideration is to apply digital signal filtering to reduce noise for better locating the calculated start time [10] and calculated end time [17] values.

Figure 11:
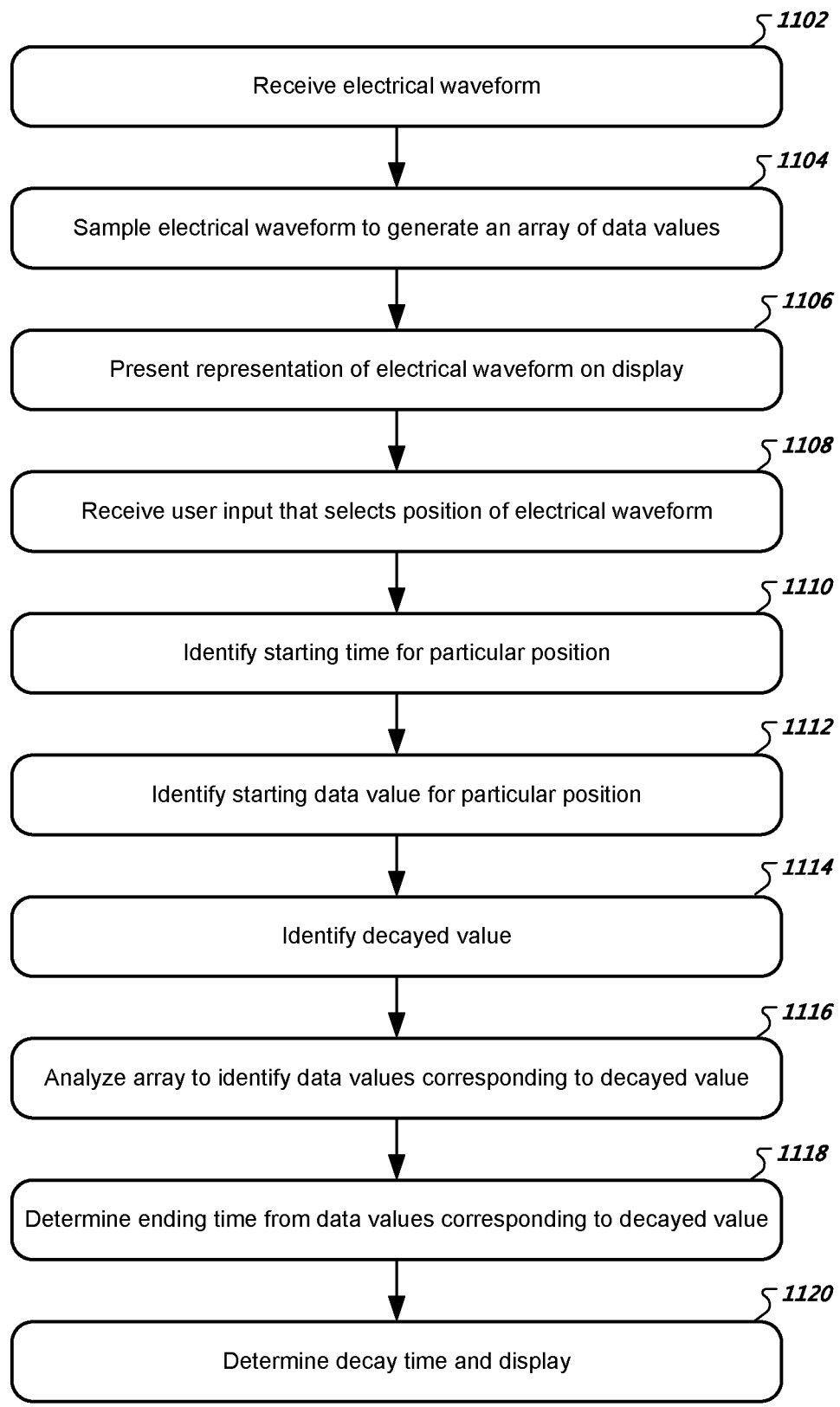
FIG. 11 shows a diagram of computing device that may be used to implement the systems and methods described in this document.

FIG. 11 shows a flowchart of a method to characterize a device under test. This flowchart is directed to the second method that is described in this disclosure, although many features of that method are similar to those performed with respect to the first and third methods. As such, this description is sometimes supplemented by operations that would be performed to implement the first and/or third methods. Moreover, the three methods described through this disclosure are primary embodiments, but various operations may be interchanged between the methods, for example, as described below.

In box 1102, an electronic test instrument receives an electrical waveform. For example, an oscilloscope [9] that is configured as shown in FIG. 2 may receive a ESD from the ESD Simulator [6].

In box 1104, the electrical test instrument samples the electrical waveform to generate an array of data values that represent a magnitude of an electrical characteristic of the electrical waveform at corresponding points in time. For example, the oscilloscope may determine the amperage of the electrical waveform at regular time intervals and may store those sample values in an array. In some implementations, the oscilloscope may store voltage values in the array.

In box 1106, the electrical test instrument presents a representation of the electrical waveform on the display of the electronic test instrument. For example, the oscilloscope may present a pixelated version of data in the array on the display of the electronic test instrument. The resolution of the display may be such that there are more array values than pixels in the horizontal direction of the display, and thus the value selected for a particular pixel may be a combination of multiple values in the array (e.g., an average of 20 array values that cover the same amount of time) or may be the result of an interpolation generated through analysis of the array. As such, the magnitude of the pixel that is represented on the display (e.g., its position on the display and/or an indicated value when selected by a cursor) may be different than any corresponding data value in the array of data values.

In box 1108, the electrical test instrument receives user input that selects a particular position of the electrical waveform that is presented on the display of the electronic test instrument. For example, an oscilloscope may receive user input that moves a vertical-line cursor horizontally across the display of the electronic test instrument until the vertical-line cursor rests at a position that corresponds to the starting time.

In some embodiments, the selected position corresponds to the ending time rather than the starting time. In some embodiments, the selected position (and therefore the time) may be pre-determined, such as with the first method described in this disclosure in which the first selected position is designated by instructions of the electronic test instrument. This pre-determined position may represent the position of the starting time or the position of the ending time. In some embodiments, the starting or ending position may be automatically calculated by the electronic test instrument as a value that falls within a region of stability, as described for the third method of this disclosure (and the system may identify multiple such values that fall within any such regions of stability).

In box 1110, the electronic test instrument identifies a time that corresponds to the particular position that was selected (e.g., by user input, by a pre-designated value, or automatically by algorithmic processing). For example, the particular position may represent a pixelated value, and the electronic test instrument may have to determine an underlying position in the array from which to select a data value. This position may correspond to the starting time in some implementations, and the ending time in other implementations.

In box 1112, the electronic test instrument identifies a data value in the array of data values that corresponds to the particular position that was selected. This data value may represent the starting data value or the ending data value, depending on the configuration of the electronic test instrument. For example, the amperage data value in the array may be selected directly based on the particular position that was selected by user input, or may be selected after the electronic test instrument has identified the starting time, as described above.

In box 1114, the electronic test instrument identifies a decayed value that identifies a level of the starting data value decayed by a particular amount. For example, the decayed value may be a value that is 36.8% of the starting value (i.e., 0.367879441 of the starting value). The decayed value can be other percentages of the starting value, which can be indicated by user input. In those implementations in which the system first selects an ending value rather than a starting value, the selected value may represent the value to which the waveform decays, and the electronic test instrument may instead identify an initial value, such that the ending value is 36.8% of the initial value. The initial value may be 271.7% of the ending value.

In box 1116, for those implementations in which a starting value was initially selected, the electronic test instrument analyzes the array of data values to identify multiple data values in the array of data values that correspond to the decayed value. In some examples, such analysis involves determining the first and last values that correspond to the decayed value. In other words, the instrument may identify a first-encountered data value that has the decayed value when analyzing the data array moving forward starting from the starting data value, and may also identify a last-encountered data value that has the decayed value when moving forward in the array from the starting data value. The last-encountered data value may be determined by traversing the array of values from front to back to determine the last-encountered value that has the decayed value, or may be determined by traversing the array of values from back to front to determine the first-encountered value that has the decayed value. In some implementations, when traversing the array of values, all values that have the decayed value (or the initial value when the ending value was initially selected) are identified.

In box 1118, for those implementations in which a starting value was initially selected, the electronic test instrument determines an ending time using the multiple data values that correspond to the decayed value. For example, the oscilloscope may identify as the ending time a time that has a designated relationship between a time of the first-encountered data value with the decayed value and a time of the last-encountered data value with the decayed value. This designated time relationship may be the time that is 36.8% between the time of the first-encountered value with the decayed value and the time of the last-encountered value with the decayed value. The ending time may be selected using other mechanisms, for example, the time that is a mid-point between the times of the first-encountered and last-encountered values described above. In some implementations, the first-encountered and last-encountered values (and potentially other values that have the decayed value) may be input into an algorithm that analyzes the magnitudes of the values and outputs a resulting magnitude or time. For example, such an algorithm may identify a mean or average time of locations that have the decayed value, and may set that time as the ending time.

In box 1120, the electronic test instrument determines a decay time between the starting time and the ending time. For example, the oscilloscope may calculate a time between the starting time and the ending time. In some implementations, the electronic test instrument may determine the decay time for each of multiple matched pairs of starting and ending times, and may select a decay from among the multiple determined decay times, or may generate a decay time using a process that receives as input the multiple decay times and outputs a single generated decay time that may differ from each of the multiple input decay times (e.g., an averaging mechanism).

In some examples, the operations of boxes 1110, 1112, 1114, 1116, 1118, and 1120 (or any subset thereof, such as boxes 1116, 1118, 1120) are performed without having received user input subsequent to receiving the user input provided at box 1108. As such, there may be no user input that specifies the multiple values (box 1116), the ending time (box 1118), or the decay time (box 1120).

The electronic test instrument may also present the determined display time on a display device. The display device may be the display of the electronic test instrument, for example, the same display with which a user manipulated a cursor to select the initial data value.

Embodiments of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non transitory program carrier for execution by, or to control the operation of, data processing apparatus. Alternatively or in addition, the program instructions can be encoded on an artificially generated propagated signal, e.g., a machine-generated electrical, optical, or electromagnetic signal, that is generated to encode information for transmission to suitable receiver apparatus for execution by a data processing apparatus. The computer storage medium can be a machine-readable storage device, a machine-readable storage substrate, a random or serial access memory device, or a combination of one or more of them. The computer storage medium is not, however, a propagated signal.

The term "data processing apparatus" encompasses all kinds of apparatus, devices, and machines for processing data, including by way of example a programmable processor, a computer, or multiple processors or computers. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, or a combination of one or more of them.

A computer program (which may also be referred to or described as a program, software, a software application, a module, a software module, a script, or code) can be written in any form of programming language, including compiled or interpreted languages, or declarative or procedural languages, and it can be deployed in any form, including as a stand-alone program or as a module, component, subroutine, or other unit suitable for use in a computing environment. A computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub programs, or portions of code. A computer program can be deployed to be executed on one computer or on multiple computers that are located at one site or distributed across multiple sites and interconnected by a communication network.

As used in this specification, an "engine," or "software engine," refers to a software implemented input/output system that provides an output that is different from the input. An engine can be an encoded block of functionality, such as a library, a platform, a software development kit ("SDK"), or an object. Each engine can be implemented on any appropriate type of computing device, e.g., servers, mobile phones, tablet computers, notebook computers, music players, e-book readers, laptop or desktop computers, PDAs, smart phones, or other stationary or portable devices, that includes one or more processors and computer readable media. Additionally, two or more of the engines may be implemented on the same computing device, or on different computing devices.

The processes and logic flows described in this specification can be performed by one or more programmable computers executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Computers suitable for the execution of a computer program include, by way of example, can be based on general or special purpose microprocessors or both, or any other kind of central processing unit. Generally, a central processing unit will receive instructions and data from a read only memory or a random access memory or both. The essential elements of a computer are a central processing unit for performing or executing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

Computer readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

Embodiments of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), e.g., the Internet.

The computing system can include clients and servers. A client and server are generally remote from each other and typically interact through a communication network. The relationship of client and server arises by virtue of computer programs running on the respective computers and having a client-server relationship to each other.

While this specification contains many specific implementation details, these should not be construed as limitations on the scope of any invention or of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In certain implementations, multitasking and parallel processing may be advantageous.

It will thus be seen that the objects set forth above, among those made apparent from the preceding description, are efficiently attained and, because certain changes may be made in carrying out the above method and in the construction(s) set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. An electronic-implemented method to characterize a device under test, comprising:
   receiving, by an electronic test instrument, an electrical waveform from the device under test;
   sampling, by the electronic test instrument, the electrical waveform to generate an array of data values that represent a magnitude of an electrical characteristic of the electrical waveform at corresponding points in time;
   presenting, by the electronic test instrument, a representation of the electrical waveform on a display of the electronic test instrument;
   receiving, by the electronic test instrument, user input that selects an arbitrary, user-selected position of the electrical waveform that is presented on the display of the electronic test instrument;
   identifying, by the electronic test instrument, a starting time that corresponds to the usr-selected position that was selected by user input;
   identifying, by the electronic test instrument, a starting data value in the array of data values that corresponds to the user-selected position that was selected by user input;
   identifying, by the electronic test instrument, a decayed value that identifies a level of the starting data value decayed by a pre-determined amount;
   analyzing, by the electronic test instrument, the array of data values to identify multiple data values in the array of data values that correspond to the decayed value;
   determining, by the electronic test instrument, an ending time using the multiple data values in the array of data values that correspond to the decayed value;
   determining, by the electronic test instrument after the decayed value has been identified, a decay time between the starting time and the ending time; and
   presenting, by the electronic test instrument and on a display device, the determined decay time.

2. The electronic-implemented method of claim 1, wherein receiving the user input that selects the use-selected position of the electrical waveform includes receiving user input that moves a vertical-line cursor horizontally across the display of the electronic test instrument until the vertical-line cursor rests at a position that corresponds to the starting time.

3. The electronic-implemented method of claim 1, wherein presenting the representation of the electrical waveform on the display of the electronic test instrument includes generating a pixel-based representation of the electrical waveform based on the array of data values, with a magnitude value for at least one pixel being different than any corresponding data value in the array of data values.

4. The electronic-implemented method of claim 1, wherein the pre-determined amount is 63.2% such that identifying the decayed value that identifies a level of the starting data value decayed by the pre-determined amount includes identifying a value that identifies the level of the starting value decayed by 63.2%.

5. The electronic-implemented method of claim 1, wherein presenting the decay time on the display device includes presenting the decay time on the display of the electronic test instrument.

6. The electronic-implemented method of claim 1, wherein sampling the electrical waveform to generate the array of data values that represent the magnitude of the electrical characteristic of the electrical waveform at the corresponding points in time includes generating an array of amperages of the electrical waveform at the corresponding points in time.

7. The electronic-implemented method of claim 1, wherein analyzing the array of data values to identify multiple data values in the array of data values that correspond to the decayed value includes:
   (i) identifying, by the electronic test instrument, a first-encountered data value at a first position in the array of data values that has the decayed value moving forward from the starting data value, and
   (ii) identifying, by the electronic test instrument, a last-encountered data value at a second position in the array of data values that has the decayed value moving forward from the starting data value, wherein the first position is different from the second position.

8. The electronic-implemented method of claim 7, wherein identifying the last-encountered data value that has the decayed value moving forward from the starting data value includes identifying a first-encountered data value during a searching of the data values in the array of data values from an end of the array of data values moving forward.

9. The electronic-implemented method of claim 7, wherein determining the ending time using the multiple data values includes identifying an ending time that has a designated time relationship between a time of the first-encountered data value and a time of the last-encountered data value.

10. The electronic-implemented method of claim 9, wherein the designated time relationship between the time of the first-encountered data value and the time of the last-encountered data value is 36.8% of time between the time of the first-encountered data value and the time of the last-encountered data value.

11. An electronic test instrument, comprising:
   lead inputs to receive an electrical waveform from a device under test;
   one or more samplers to sample an electrical waveform;
   a display to present a display of the electrical waveform;
   one or more processors; and
   one or more non-transitory computer-readable devices including instructions that, when executed by the one or more processors, cause the electronic test instrument to:
      receiving, by an electronic test instrument, an electrical waveform from the device under test;

sampling, by the electronic test instrument, the electrical waveform to generate an array of data values that represent a magnitude of an electrical characteristic of the electrical waveform at corresponding points in time;

presenting, by the electronic test instrument, a representation of the electrical waveform on a display of the electronic test instrument;

receiving, by the electronic test instrument, user input that selects an arbitrary, user-selected position of the electrical waveform that is presented on the display of the electronic test instrument;

identifying, by the electronic test instrument, a starting time that corresponds to the user-selected position that was selected by user input;

identifying, by the electronic test instrument, a starting data value in the array of data values that corresponds to the user-selected position that was selected by user input;

identifying, by the electronic test instrument, a decayed value that identifies a level of the starting data value decayed by a pre-determined amount;

analyzing, by the electronic test instrument, the array of data values to identify multiple data values in the array of data values that correspond to the decayed value;

determining, by the electronic test instrument, an ending time using the multiple data values in the array of data values that correspond to the decayed value;

determining, by the electronic test instrument after the decayed value has been identified, a decay time between the starting time and the ending time; and presenting, by the electronic test instrument and on a display device, the determined decay time.

12. The electronic test instrument of claim 11, wherein receiving the user input that selects the user-selected position of the electrical waveform includes receiving user input that moves a vertical-line cursor horizontally across the display of the electronic test instrument until the vertical-line cursor rests at a position that corresponds to the starting time.

13. The electronic test instrument of claim 11, wherein presenting the representation of the electrical waveform on the display of the electronic test instrument includes generating a pixel-based representation of the electrical waveform based on the array of data values, with a magnitude value for at least one pixel being different than any corresponding data value in the array of data values.

14. The electronic test instrument of claim 11, wherein the pre-determined amount is 63.2% such that identifying the decayed value that identifies a level of the starting data value decayed by the pre-determined amount includes identifying a value that identifies the level of the starting value decayed by 63.2%.

15. The electronic test instrument of claim 11, wherein presenting the decay time on the display device includes presenting the decay time on the display of the electronic test instrument.

16. The electronic test instrument of claim 11, wherein sampling the electrical waveform to generate the array of data values that represent the magnitude of the electrical characteristic of the electrical waveform at the corresponding points in time includes generating an array of amperages of the electrical waveform at the corresponding points in time.

17. The electronic test instrument of claim 11, wherein analyzing the array of data values to identify multiple data values in the array of data values that correspond to the decayed value includes:
(i) identifying, by the electronic test instrument, a first-encountered data value at a first position in the array of data values that has the decayed value moving forward from the starting data value, and
(ii) identifying, by the electronic test instrument, a last-encountered data value at a second position in the array of data values that has the decayed value moving forward from the starting data value, wherein the first position is different from the second position.

18. The electronic test instrument of claim 17, wherein identifying the last-encountered data value that has the decayed value moving forward from the starting data value includes identifying a first-encountered data value during a searching of the data values in the array of data values from an end of the array of data values moving forward.

19. The electronic test instrument of claim 17, wherein determining the ending time using the multiple data values includes identifying an ending time that has a designated time relationship between a time of the first-encountered data value and a time of the last-encountered data value.

20. The electronic test instrument of claim 19, wherein the designated time relationship between the time of the first-encountered data value and the time of the last-encountered data value is 36.8% of time between the time of the first-encountered data value and the time of the last-encountered data value.

* * * * *